United States Patent
Byun et al.

(10) Patent No.: US 6,804,047 B2
(45) Date of Patent: Oct. 12, 2004

(54) ALL-OPTICAL OR GATE EMBODIED BY USING SEMICONDUCTOR OPTICAL AMPLIFIERS

(75) Inventors: Young Tae Byun, Guri (KR); Young Min Jhon, Seoul (KR); Jae Hun Kim, Seoul (KR); Seok Lee, Seoul (KR); Deok Ha Woo, Seoul (KR); Sun Ho Kim, Goyang (KR); Kwang Nam Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 113 days.

(21) Appl. No.: 10/185,062

(22) Filed: Jun. 28, 2002

(65) Prior Publication Data

US 2003/0058528 A1 Mar. 27, 2003

(30) Foreign Application Priority Data

Sep. 25, 2001 (KR) ........................................ 2001-59367

(51) Int. Cl.[7] .............................. G02F 3/00; H01S 3/00
(52) U.S. Cl. ....................... 359/344; 359/107; 359/108; 359/333; 385/11; 385/15
(58) Field of Search ................................ 359/107, 108, 359/333, 344, 900; 385/11, 15

(56) References Cited

U.S. PATENT DOCUMENTS

| | | | | |
|---|---|---|---|---|
| 3,643,116 A | * | 2/1972 | Culver et al. ................ | 359/108 |
| 4,932,739 A | * | 6/1990 | Islam .......................... | 359/108 |
| 6,192,063 B1 | * | 2/2001 | Kim et al. .................... | 372/94 |
| 6,424,438 B1 | * | 7/2002 | Byun et al. .................. | 359/108 |
| 6,624,929 B2 | * | 9/2003 | Kim et al. ................... | 359/344 |
| 2002/0001112 A1 | * | 1/2002 | Song .......................... | 359/107 |
| 2002/0054404 A1 | * | 5/2002 | Hedekvist et al. .......... | 359/108 |
| 2003/0058527 A1 | * | 3/2003 | Kim et al. ................... | 359/344 |
| 2003/0198476 A1 | * | 10/2003 | Ohya et al. ................. | 398/141 |

OTHER PUBLICATIONS

Islam, MN, "Ultrafast all optical logic gates based on Soliton trapping in fibers", 11/89, Optics Letters, vol. 14, #22, pp. 1257–1259.*
Ranon et al, "Planar geometry . . . all optical programable switch", Nov. 10, 1996, Applied Optics, vol. 35, #32, pp 6390–6396.*
Wong et al, "design of . . . intensity and polarization–encoding schemes", Jun. 10, 1992, Applied optics, vol. 31, #17, pp 3225–3232.*
Domanski et al, "Polarization based all optical bistable element", Mar. 15, 1991, Proc. of SPIE, vol. 1515, pp 59–66.*

* cited by examiner

*Primary Examiner*—Nelson Moskowitz
(74) *Attorney, Agent, or Firm*—Harness, Dickey & Pierce, P.L.C.

(57) ABSTRACT

The present invention is related to an all-optical OR device embodied by using the gain saturation and wavelength conversion characteristics of semiconductor optical amplifier (SOA), and more particularly, to a technique to embody an all-optical OR gate that performs all-optical logic operation by utilizing optical signals transmitted at arbitrary points of optical circuits such as optical computing circuits as the pump signal and the probe signal.

4 Claims, 3 Drawing Sheets

ALL-OPTICAL OR GATE EMBODIED BY USING SEMICONDUCTOR OPTICAL AMPLIFIERS

BACKGROUND OF THE INVENTION

1. Field of the Invention

The present invention is related to an all-optical OR gate embodied by using the gain saturation and wavelength conversion characteristics of semiconductor optical amplifier (SOA). More particularly, the present invention is related to a technique to embody an all-optical OR gate that performs all-optical logic operation by utilizing optical signals transmitted from arbitrary points of optical circuits such as optical computing circuits as a pump signal and a probe signal.

2. Description of the Related Art

In recent years, needs for high speed and large capacity of optical systems have been increased dramatically. Since the future information networks have to be prepared for multimedia services like voice signals, stationary images, and animated images, the information processing capacity of backbone networks is expected to increase from several hundred Gbit/s to several Tbit/s. Therefore, in order to transmit, process, and communicate large capacity of data, all-optical signal processing techniques have emerged as the core technology.

Particularly, since all-optical logic operations can avoid the cumbersome electro-optic conversion, it is considered as the core technology for all-optic signal processing systems. Therefore, technologies of all-optical logic gates are being developed actively in the fields of optical computing and all-optical signal processing.

Up to now, all-optical logic gate s for ultra-high speed optical information processing have been utilizing mainly the non-linear characteristics of semiconductor optical amplifiers (SOAs). For examples, all-optical logic gates are relying on mechanisms such as four-wave mixing (FWM), cross gain modulation (XGM), cross phase modulation (XPM) cross-absorption modulation (XAM), or combinations of these.

Therefore, all-optical OR gates in the prior art were realized by methods using ultra fast nonlinear interferometer (UNI) utilizing the nonlinear gain and refractive index change of semiconductor optical amplifier (SOA) [Refer to N. S. Patel, K. L. Hall, and K. A. Rauschenbach, Opt. Lett. Vol. 21, 1466 (1996)] and integrated SOA-based Michelson interferometer [Refer to T. Fjelde, D. Wolfson, A. Kloch, C. Janz, A. Coquelin, I. Guillemot, F. Gaborit, F. Poingt, B. Dagens, and M. Renaud, *Elecronic Letters*, Vol. 36, 813 (2000)].

However, in order for a plurality of all-optical logic gates such as AND, NAND, OR, NOR, and XOR to be used in complicated optical circuits of optical computing or all-optical signal processing systems, each of all-optical logic gates is desired to embody on the same operational principle for a favorable system constitution. By utilizing the gain saturation and the wavelength conversion characteristics of SOA, all-optical NOR, XOR, and NAND as well as all-optical OR gate in accordance with the present invention could be embodied. [For all-optical NOR, refers to Y. T. Byun, S. H. Kim, D. H. Woo, D. H. Kim, and S. H. Kim, *New Physics*, Vol. 40, 560 (2000).]

SUMMARY OF THE INVENTION

The present invention is to solve the above mentioned problems in the prior art. It is an object of the present invention to provide a device embodied for all-optical OR gates by using the characteristics of gain saturation and wavelength conversion of semiconductor optical amplifiers (SOAs).

To achieve the aforementioned object, the present invention provides with all-optical OR logic device in which 2.5 Gbit/s input signal generates four logic signals by way of mode-locked fiber laser and multiplexing techniques and then these logic signals and the probe signal are under the effect of the gain saturation and the wavelength conversion characteristics while transmitting through the semiconductor optical amplifier (SOA).

The above and other features and advantages of the present invention will be more clearly understood for those skilled in the art from the following detailed description in conjunction with the accompanying drawings, which form part of this disclosure.

DETAILED DESCRIPTION OF THE EMBODIMENT

Hereinafter, the constitution and operation of the present invention is described in detail through preferred embodiments by referring to the accompanying drawings.

Figure 1:
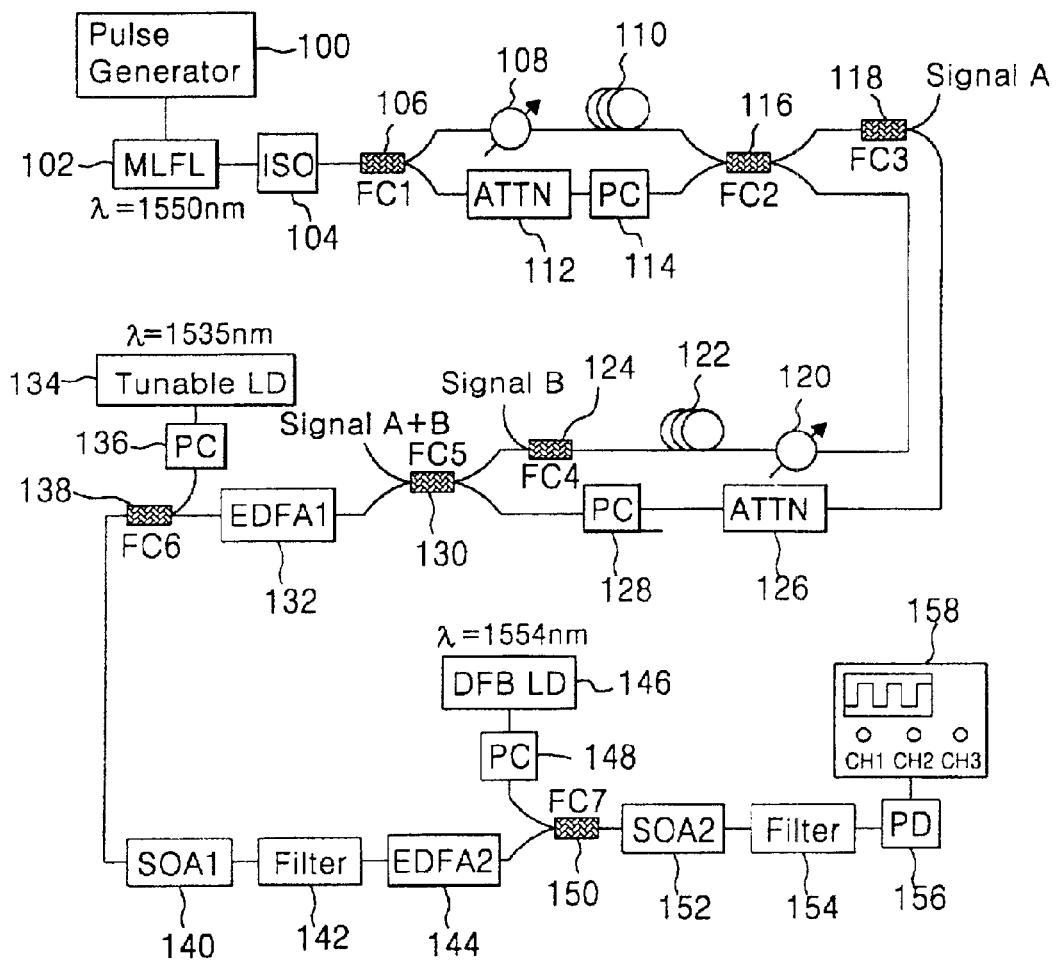
FIG. 1 illustrates the configuration diagram embodying an all-optical OR gate in accordance with the present invention.
Figure 2:
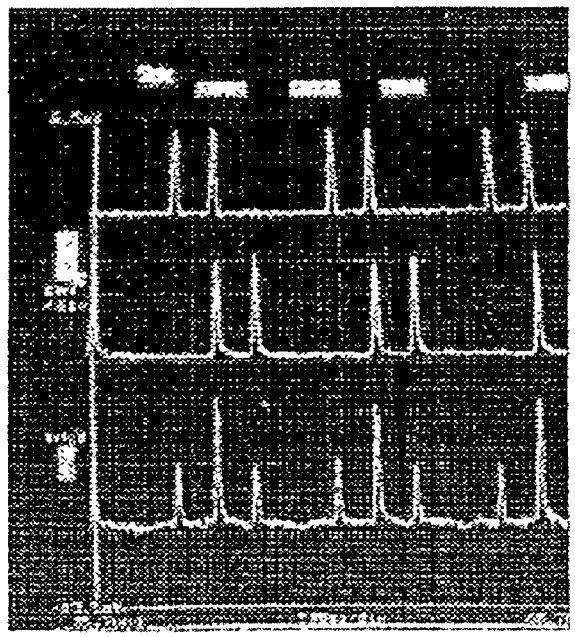
FIG. 2 shows waveforms of signals A and B for all-optical OR gate in accordance with the present invention and the sum A+B of the two input signals.
Figure 3:
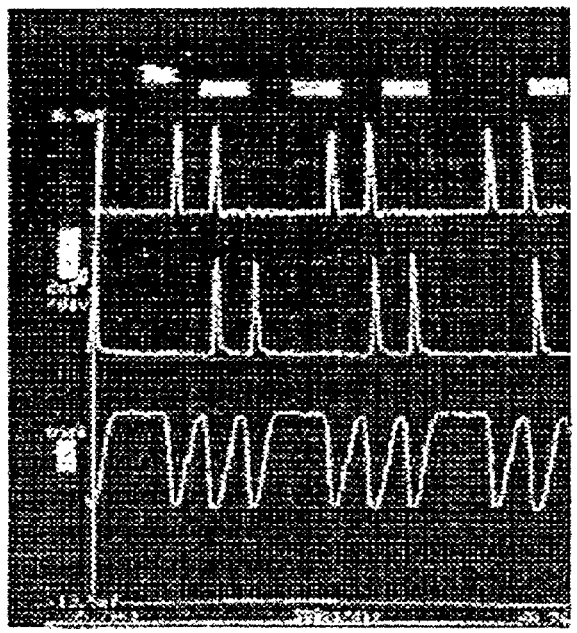
FIG. 3 shows waveforms of signals A and B for all-optical OR gate in accordance with the present invention and the wavelength-converted signal.
Figure 4:
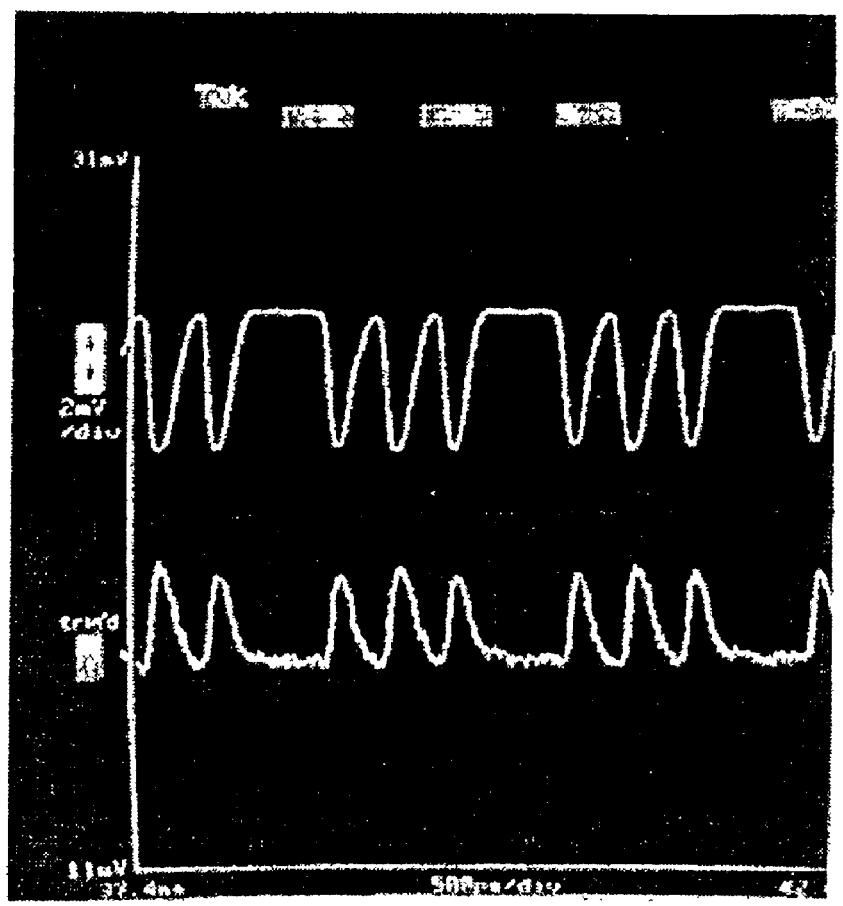
FIG. 4 illustrates the characteristic of all-optical OR gate operating at 2.5 Gbit/s in accordance with the present invention.

FIG. 1 illustrates the configuration diagram of an apparatus embodying an all-optical OR gate in accordance with the present invention. FIG. 2 shows waveforms of signals A and B for the all-optical OR gate and the sum of the two input signals, A+B. FIG. 3 shows waveforms of signals A and B for the all-optical OR gate and the wavelength-converted signal. FIG. 4 illustrates the characteristic of the all-optical OR gate operating at 2.5 Gbit/s.

An embodiment as shown in FIG. 1 in accordance with the present invention comprises; an optical pulse generator (100); a mode-locked fiber laser (MLFL; 102) for generating input signal patterns A and B for all-optical OR gate from the said pulse generator (100); the first fiber coupler (FC1; 106) for branching the output from said mode-locked fiber laser (102) through an isolator (ISO; 104) by branching ratio of 50:50; the first optical delay means for time-delaying the output from the said first fiber coupler (106) by using a variable delay (108) and a single mode fiber (110); the first optical control means for controlling the intensity and the polarization of the optical output from the said first fiber coupler (106) by using an attenuator (ATTN; 112) and a polarization controller (PC; 114); the second fiber coupler (FC2; 116) for generating the input signal pattern A (1100) by coupling optical outputs from the said first delay means and first optical control means; the third fiber coupler (FC3; 118) for branching the optical output from the said second fiber coupler (FC2; 116) by branching ratio of 10:90; the second delay means for time-delaying the optical output from the said second fiber coupler (116) by using a variable delay (120) and a single mode fiber (SMF; 122); the fourth fiber coupler (FC4; 124) for detecting the input signal pattern B(0110) generated from the said second delay means; the second optical control means for controlling the intensity and the polarization of the optical output from the said third fiber coupler (118) by using an attenuator (ATTN; 126) and a polarization controller (PC; 128); the fifth fiber coupler (FC5; 130) for generating the input signal pattern A+B by coupling the input signal pattern A from the said third fiber coupler (118) and the input signal pattern B from the said fourth fiber coupler (124); and means for detecting and measuring the input signal pattern A+B generated from the said fifth fiber coupler (130).

The embodiment can further comprise; the first Erbium-doped fiber amplifier (EDFA1; 132) for amplifying the input signal pattern A+B generated from the said fifth fiber coupler (130); a wavelength tunable laser diode (Tunable LD; 134) for functioning as the light source of probe signal of continuous-wave being passed through polarization controller (PC; 136); the sixth fiber coupler (FC6; 138) for coupling the input signal pattern A+B for the said first Erbium-doped fiber amplifier (132) and the continuous-wave probe signal from the said tunable laser diode (134) by coupling ratio of 50:50; the first semiconductor optical amplifier (SOA1; 140) for generating the wavelength-converted signal pattern C by the SOA characteristics of gain saturation and wavelength conversion from the input signal pattern A+B that is input from the said sixth fiber coupler (138) concurrently with the probe signal; and the first optical filter (142) for filtering only the probe signal from the said first semiconductor optical amplifier (140).

The embodiment can also further comprise; the second Erbium-doped fiber amplifier (EDFA2; 144) for amplifying the wavelength-converted signal pattern C from the said first semiconductor optical amplifier (140); a distributed feedback laser diode (DFB-LD; 146) for generating continuous-wave optical signal through a polarization controller (PC; 148); the seventh fiber coupler (FC7; 150) for coupling the signal pattern C amplified at the said second Erbium-doped fiber amplifier (144) and the continuous-wave optical signal from the said distributed feedback laser diode (146) by coupling ratio of 50:50; the second semiconductor optical amplifier (SOA2; 152) for generating new wavelength-converted signal pattern by the SOA characteristics of gain saturation and wavelength conversion from the input signal pattern C that is functioning as the pump-signal and inputted from the said seventh fiber coupler (150) concurrently with the continuous-wave optical signal as the probe signal; the second optical filter (154) for filtering only the probe signal from the said second semiconductor optical amplifier (152); a photo-detector (PD; 156) for detecting the optical output from the said second optical filter (154); and a sampling oscilloscope (158) for measuring the detected optical output from the said photo-detector (156).

Now the embodying process of all-optical OR logic device in accordance with the present invention is described by referring to FIGS. 2, 3, and 4.

First, the input signal patterns A and B for verifying the all-optical OR logic operation are driven by a mode-locked fiber laser (MLFL; 102) having the wavelength of 1550 nm. The optical output from the mode-locked fiber laser (102) is branched by the first fiber coupler (FC1; 106) having branching ratio of 50:50, and then passed through the variable delay (108) and 4 m long single mode fiber (110) as delay means to obtain time delay of 400 ps and through the attenuator (ATTN; 112) and the polarization controller (PC; 114) as control means; and then coupled at the second fiber coupler (FC2; 116) having branching ratio of 50:50 to generate the input signal pattern A(1100) operating at 2.5 Gbit/s.

Now, the upper fiber of output end of the second fiber coupler (116) is branched at the third fiber coupler (FC3; 118) having branching ratio of 10:90 and then the optical output (1100) of the upper fiber is measured with a 20 GHz-sampling oscilloscope. The optical output (1100) of the lower fiber is passed through the attenuator (ATTN; 126) and the polarization controller (PC; 128) and then coupled with the input signal pattern B(0110) at the fifth fiber coupler (FC5; 130).

On the other hand, the input signal pattern A(1100) from the lower fiber of the output end of the second fiber coupler (FC2; 116) is passed through the variable delay (120) and 4 m-long single mode fiber (SMF; 122) to obtain time delay of 400 ps and then the input signal pattern B(0110) is generated. This signal is branched at the fourth fiber coupler (FC4; 124) having branching ratio of 10:90 and then the optical output (0110) of the upper fiber is measured at a 45 GHz photodetector and a sampling oscilloscope. And the optical output of the lower fiber is coupled with the input signal pattern A(1100) at the fifth fiber coupler (FC5; 130). The optical output from the upper fiber of output end of the fifth fiber coupler (FC5; 130), which is the sum of input signal patterns A and B, i.e., A+B, is measured by another 45 GHz photodetector and the sampling oscilloscope.

FIG. 2 shows the input signal pattern A(1100) of 2.5 Gbit/s measured from the upper fiber of output end of the third fiber coupler (FC3; 118), the input signal pattern B(0110) of 2.5 Gbit/s measured from the upper fiber of output end of the fourth fiber coupler (FC4; 124), and also the input signal pattern A+B of 2.5 Gbit/s measured from the upper fiber of output end of the fifth fiber coupler (FC5; 130).

Now, the input signal pattern A+B from the lower fiber of output end of the fifth fiber coupler (FC5; 130) is amplified at the first Erbium-doped fiber amplifier (EDFA1; 132), is coupled at the sixth fiber coupler (FC6; 138) having branching ratio of 50:50 with continuous-wave optical signal from the tunable laser diode at the 1535 nm wavelength, and then is fed to the first semiconductor optical amplifier (SOA1; 140).

At this stage, the signal pattern C, which is wavelength-converted due to the gain saturation and wavelength conversion characteristics of the said first semiconductor optical amplifier (SOA1; 140), is generated. In other words, since the probe signal out of the output signals from the said first optical amplifier (SOA1; 140) passes through the first optical filter (142) but the input signal pattern A+B does not pass through, the wavelength-converted signal pattern C has the wavelength of 1535 nm.

FIG. 3 shows the input signal patterns A and B of 2.5 Gbit/s, and also the wavelength-converted signal pattern C of 2.5 Gbit/s measured at the output end of the first optical filter (142) when the driving currents for the first Erbium-doped fiber amplifier (EDFA1; 132) and the first semiconductor optical amplifier (SOA1; 140) are 80 mA and 150 mA, respectively. When two logic signals from the input signal patterns A and B are (1,0), (1,1), or (0,1), the wavelength-converted signal pattern C has no optical output, while the optical output exists for the case of (0,0). However, since the input signal is pulse-type, it is shown that the wavelength-converted output signal exists between optical pulses.

Now, the wavelength-converted signal pattern C is amplified at the second Erbium-doped fiber amplifier (EDFA2;

144), coupled at the seventh fiber coupler (FC7; 150) having branching ratio of 50:50 with the probe signal of the 1554 nm wavelength generated by the distributed-feedback laser diode (DFB-LD; 146), and then fed to the second semiconductor optical amplifier (SOA2; 152). At this stage, the wavelength-converted input signal C is used as the pump signal for the second semiconductor optical amplifier (SOA2; 152), while the continuous-wave optical signal from the distributed-feedback laser diode (DFB-LD; 146) is used as the probe signal. The pump signal with high intensity is gain-saturated by exhausting the carrier concentration in the second semiconductor optical amplifier (SOA2; 152). As a result, the probe signal has the output from the second semiconductor optical amplifier (SOA2; 152) only when there is no pump signal. Therefore, when the optical output from the second semiconductor optical amplifier (SOA2; 152) is fed to the second optical filter, only the wavelength of the probe signal is filtered through and this filtered signal is measured by the 45 GHz photodetector and the sampling oscilloscope.

FIG. 4 shows the operational characteristics of all-optical OR gate operating at 2.5 Gbit/s. The wavelength-converted signal pattern C shown in the upper position is a waveform which is shaped when the two input signal patterns A(1100) and B(0110) are put through the first semiconductor optical amplifier (SOA1; 140). It is shown that there is no optical output for logic signal of (1,0), (1,1), or (0,1), while the optical output exists for the case of (0,0). The probe signal shown at the lower position verifies that the operational characteristics of the all-optical OR gate is embodied when the driving currents of the second Erbium-doped fiber amplifier (EDFA2; 144) and the second semiconductor optical amplifier (SOA2; 152) are 170 mA and 150 mA, respectively.

As shown in the embodiment in accordance with the present invention, two input signal patterns A(1100) and B(0110) of the same wavelength are input to the first semiconductor optical amplifier (SOA1; 140) to make the wavelength-converted signal pattern C having four logic signals of (1,0), (1,1), (1,1), and (0,0), and when these logic signals and the probe signal from DFB-LD are passed through the second semiconductor optical amplifier (SOA2; 152), 2.5 Gbit/s all-optical OR gate is successfully embodied due to the SOA characteristics of gain saturation and wavelength conversion. Therefore, by utilizing the present invention, the all-optical logic operation can easily be embodied in the complicated optical circuits such as optical computing and all-optical signal processing systems.

As shown before, according to the device embodied for all-optical OR logic operation by using semiconductor optical amplifier in accordance with the present invention, the input signal of 2.5 Gbit/s is used to make four logic signals by a mode-locked fiber laser and multiplexing techniques, and when these logic signals and the probe signal are passed through a semiconductor optical amplifier (SOA) the all-optical OR gate is embodied by the characteristics of gain saturation and wavelength conversion.

Therefore, the present invention can be easily applied to embody the all-optical OR logic operation at the arbitrary points of complicated optical circuits such as optical computing and all-optical signal processing systems. Also, the present invention can be applied not only in embodying all-optical logic elements like all-optical NOR, NAND, XOR, and AND, but also to make ultrahigh-speed all-optical logic elements operated at higher than 10 Gbit/s.

Although the present invention has been described along with the accompanying drawings, this only illustrates preferred embodiments but does not limit the scope of the present invention. It will be apparent for those skilled in the art that various modifications may be made without departing from the spirit and scope of the present invention as defined by the appended claims.

What is claimed:

1. A device embodied for all-optical OR logic operation comprising;

an optical pulse generator;

a mode-locked fiber laser (MLFL) for generating input signal patterns A and B for all-optical OR logic operation from said pulse generator;

the first fiber coupler (FC1) for branching the optical output from said mode-locked fiber laser by branching ratio of 50:50;

the first optical delay means for time-delaying the optical output from the said first fiber coupler;

the first optical control means for controlling the intensity and the polarization of the optical output from the said first fiber coupler;

the second fiber coupler (FC2) for generating the input signal pattern A by coupling optical outputs from the said first delay means and the first optical control means;

the third fiber coupler (FC3) for branching the optical output from the said second fiber coupler by branching ratio of 10:90;

the second delay means for time-delaying the optical output from the said second fiber coupler (FC2);

the fourth fiber coupler (FC4) for detecting the optical output from the said second delay means and measuring the input signal pattern B;

the second optical control means for controlling the intensity and the polarization of the optical output from the said third fiber coupler (FC3);

the fifth fiber coupler (FC5) for generating the input signal pattern A+B by coupling the input signal pattern A from the said third fiber coupler and the input signal pattern B from the said fourth fiber coupler; and means for detecting and measuring the input signal pattern A+B generated from the said fifth fiber coupler.

2. The device embodied for all-optical OR logic operation of claim 1, wherein modulated waveforms from said mode-locked fiber laser (MLFL) are modulated at 2.5 Gbit/s and then the input signal pattern A of 1100 and the input signal pattern B of 0110 are generated.

3. The device embodied for all-optical OR logic operation of claim 1 further comprising;

the first Erbium-doped fiber amplifier (EDFA1) for amplifying the input signal pattern A+B generated from the said fifth fiber coupler;

a wavelength tunable laser diode (Tunable LD) for providing continuous-wave probe signal;

the sixth fiber coupler (FC6) for coupling the input signal pattern A+B for the said first Erbium-doped fiber amplifier and said continuous-wave probe signal from said tunable laser diode by coupling ratio of 50:50;

the first semiconductor optical amplifier (SOA1) for generating the wavelength-converted signal pattern C by the SOA characteristics of gain saturation and wavelength conversion from the input signal pattern A+B that is input from the said sixth fiber coupler concurrently with the probe signal; and the first optical filter for filtering only the continuous-wave probe signal from the said first semiconductor optical amplifier.

4. The device embodied for all-optical OR logic operation of claim 3 further comprising;
- the second Erbium-doped fiber amplifier (EDFA2) for amplifying the wavelength-converted signal pattern C from the said first semiconductor optical amplifier;
- the distributed feedback laser diode (DFB-LD) for generating continuous-wave optical signal;
- the seventh fiber coupler (FC7) for coupling the signal pattern C amplified at the said second Erbium-doped fiber amplifier and the continuous-wave optical signal from said distributed feedback laser diode by coupling ratio of 50:50;
- the second semiconductor optical amplifier (SOA2) for generating new wavelength-converted signal pattern by the SOA characteristics of gain saturation and wavelength conversion using the wavelength-converted signal pattern C and the continuous-wave optical signal that are concurrently inputted from the said seventh fiber coupler as the pump-signal and the probe signal, respectively; and
- the second optical filter for filtering only the probe signal from the said second semiconductor optical amplifier.